United States Patent
Ishida et al.

(10) Patent No.: US 9,590,078 B2
(45) Date of Patent: Mar. 7, 2017

(54) SEMICONDUCTOR DEVICE FABRICATION METHOD AND SEMICONDUCTOR DEVICE

(71) Applicant: Kabushiki Kaisha Toshiba, Tokyo (JP)

(72) Inventors: Hirokazu Ishida, Kanagawa (JP); Kenichiro Toratani, Kanagawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 13/784,662

(22) Filed: Mar. 4, 2013

(65) Prior Publication Data

US 2013/0264624 A1    Oct. 10, 2013

(30) Foreign Application Priority Data

Apr. 5, 2012  (JP) ................ P2012-086639

(51) Int. Cl.
    *H01L 29/788* (2006.01)
    *H01L 29/66* (2006.01)
    *H01L 29/40* (2006.01)
    *H01L 29/423* (2006.01)
    *H01L 21/28* (2006.01)
    *H01L 27/115* (2006.01)

(52) U.S. Cl.
    CPC .. *H01L 29/66825* (2013.01); *H01L 21/28273* (2013.01); *H01L 27/11521* (2013.01); *H01L 29/401* (2013.01); *H01L 29/42332* (2013.01); *H01L 29/788* (2013.01)

(58) Field of Classification Search
    CPC ............ H01L 27/11521; H01L 29/401; H01L 29/42332; H01L 29/66825; H01L 29/788
    USPC ................... 257/314–325; 365/148
    See application file for complete search history.

(56) References Cited

U.S. PATENT DOCUMENTS

| | | | |
|---|---|---|---|
| 5,650,649 A | 7/1997 | Tsukiji | |
| 2003/0013254 A1* | 1/2003 | Tsuji | ............................ 438/257 |
| 2005/0287777 A1* | 12/2005 | Morino | ............. H01L 21/28273 |
| | | | 438/510 |
| 2006/0138523 A1* | 6/2006 | Lee et al. | ....................... 257/315 |
| 2008/0090352 A1* | 4/2008 | Lee et al. | ....................... 438/257 |
| 2009/0212344 A1* | 8/2009 | Lee | ................ 257/317 |
| 2014/0048862 A1* | 2/2014 | Fujita et al. | .................. 257/314 |

FOREIGN PATENT DOCUMENTS

| | | |
|---|---|---|
| JP | 07-099256 | 4/1995 |
| JP | 7169861 A | 7/1995 |
| JP | 08-139211 | 5/1996 |

* cited by examiner

*Primary Examiner* — Allen Parker
*Assistant Examiner* — Frederick B Hargrove
(74) *Attorney, Agent, or Firm* — Patterson & Sheridan, LLP

(57) ABSTRACT

A semiconductor device fabrication method includes forming a tunnel insulating film on a substrate containing silicon, forming a floating gate on the tunnel insulating film, forming an integral insulating film on the floating gate, and forming a control gate on the integral insulating film. The floating gate is formed on the tunnel insulating film by forming a seed layer containing amorphous silicon on the tunnel insulating film, forming an impurity later containing adsorbed boron or germanium on the seed layer, and forming a cap layer containing silicon on the impurity layer.

18 Claims, 6 Drawing Sheets

SEMICONDUCTOR DEVICE FABRICATION METHOD AND SEMICONDUCTOR DEVICE

CROSS-REFERENCE TO RELATED APPLICATION

This application is based upon and claims the benefit of priority from Japanese Patent Application No. 2012-086639, filed Apr. 5, 2012, the entire contents of which are incorporated herein by reference.

FIELD

Embodiments described herein relate to a semiconductor device fabrication method and a semiconductor device.

BACKGROUND

In semiconductor device fabrication, the thickness of the formed film needs to be reduced as the size of the semiconductor device becomes miniaturized. However, it may be difficult to form a thin film in cases where an impurity is doped into silicon. For example, it is difficult to form a thin silicon film doped with boron, because it is difficult to control the film thickness uniformity during the initial stage of the process. Also, the silicon atoms existing on the surface of the film flow significantly as a result of boron doping, causing aggregation and making it difficult to form a film with uniform thickness.

DETAILED DESCRIPTION

Embodiments provide a semiconductor device fabrication method by which a thin film can be formed even when a prescribed impurity, such as boron or germanium, is doped therein and a semiconductor device fabricated from the method.

In general, embodiments will be explained with reference to the figures. In the figures, the same constituent elements are represented by the same respective symbols and the detailed explanation will be omitted appropriately.

The semiconductor device fabrication method according to one or more embodiments can be used when forming a film doped with a prescribed impurity (e.g., boron or germanium) for various kinds of semiconductor devices, such as MOSFET (metal-oxide-semiconductor field-effect transistor) or other transistors, diodes, flash memories, or other nonvolatile semiconductor storage devices.

The semiconductor device fabrication method according to this embodiment includes forming a floating gate on the tunnel insulating film, forming an integral insulating film on the floating gate, and forming a control gate on the integral insulating film. The floating gate is formed on the tunnel insulating film by forming a seed layer containing amorphous silicon on the tunnel insulating film, forming an impurity later containing adsorbed boron or germanium on the seed layer, and forming a cap layer containing silicon on the impurity layer.

In addition, the impurity should be appropriately selected so that flowing of the silicon atoms existing on the surface of the film can be increased when the impurity is doped into the film. For example, when arsenic or phosphorous is doped into the film, flowing of the silicon atoms on the surface of the film is restrained. However, when boron or germanium is doped into the film, flowing of the silicon atoms on the surface of the semiconductor device according to this embodiment is increased. Therefore, in the semiconductor device fabrication method according to one or more embodiments, impurities such as boron and germanium are doped into the film.

In the following, as an example, a case in which the semiconductor device is a NAND type flash memory and the dopant is boron, will be explained.

First Embodiment

First, the semiconductor device fabrication method according to the first embodiment will be explained. The semiconductor device, which is a NAND type flash memory, has memory cells, word lines, bit lines, interlayer insulating film, protective film, contact, peripheral circuit parts, source/drain regions, channel regions, and the like. Since existing technologies can be applied to form the parts other than the memory cells, detailed explanation for the formation of the parts other than the memory cells is omitted.

Figure 3:
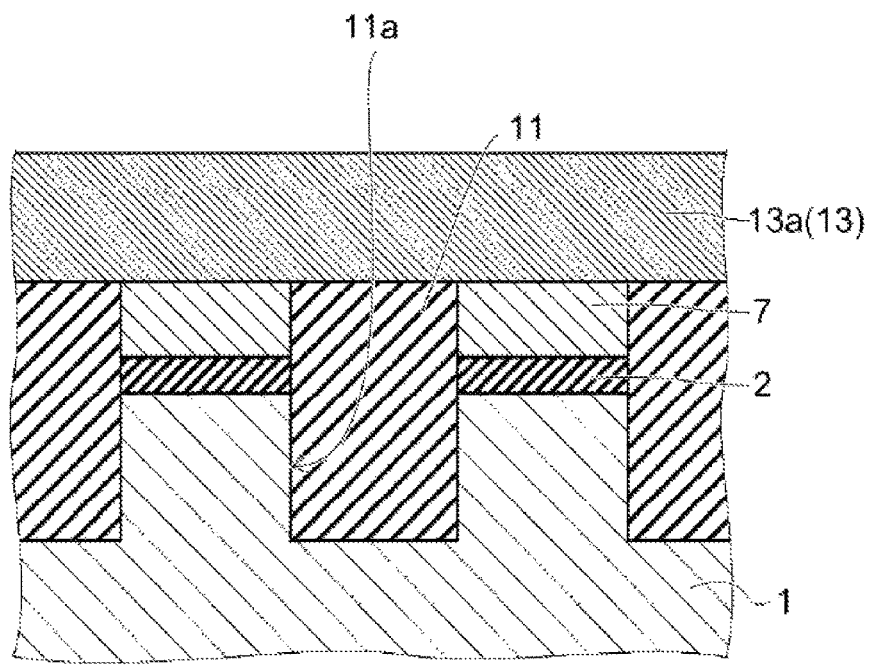
FIG. 3 is a schematic cross-sectional view illustrating a step of the semiconductor device fabrication method according to the first embodiment.
Figure 4:
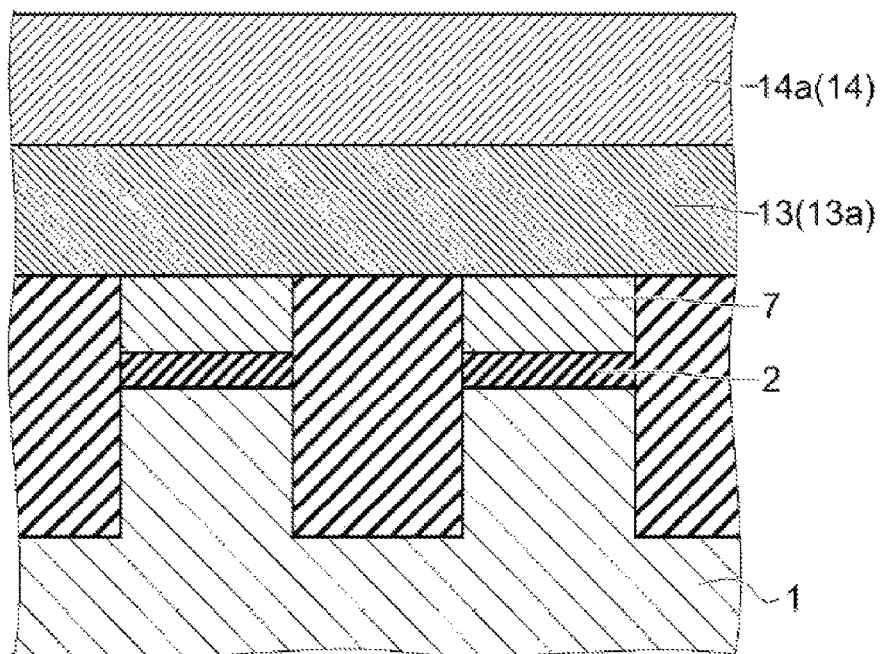
FIG. 4 is a schematic cross-sectional view illustrating a step of the semiconductor device fabrication method according to the first embodiment.
Figure 5:
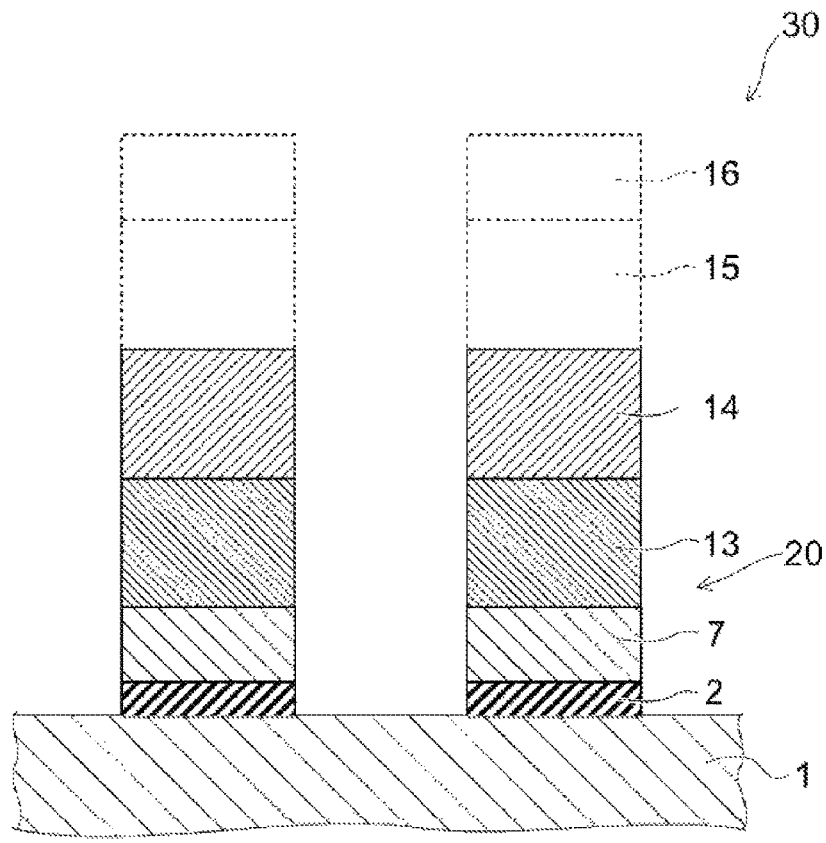
FIG. 5 is a schematic cross-sectional view illustrating steps of the semiconductor device fabrication method according to the first embodiment.

FIG. 1A, FIG. 1B, FIG. 2A, FIG. 2B, FIG. 3A, FIG. 3B, FIG. 4, and FIG. 5 are one example of schematic cross-sectional views illustrating one or more steps of the semiconductor device fabrication method according to the first embodiment. Specifically, FIG. 1A, FIG. 1B, FIG. 2A, FIG. 2B, FIG. 3A, FIG. 3B, and FIG. 4 are diagrams illustrating the cross sections in the direction of the word lines (the width direction of the channel). FIG. 5 is a diagram illustrating the cross section in the direction of the bit lines (in the direction perpendicular to the direction of the word lines).

Figure 1A:
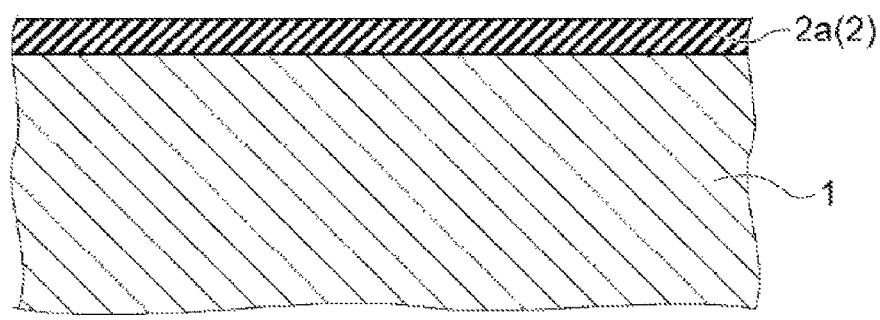
FIG. 1A and FIG. 1B are schematic cross-sectional views illustrating steps of a semiconductor device fabrication method according to a first embodiment.

First, as shown in FIG. 1A, a film 2a, which is used as a tunnel insulating film 2, is formed on silicon-containing substrate 1. The substrate 1, for example, has a p-type well formed on a p-type silicon substrate or an n-type silicon substrate. The film 2a can be formed by using, for example, a thermal oxidation method. The film 2a can be a silicon oxide film or silicon oxynitride film with a thickness in the range of 1 nm to 15 nm.

Figure 1B:
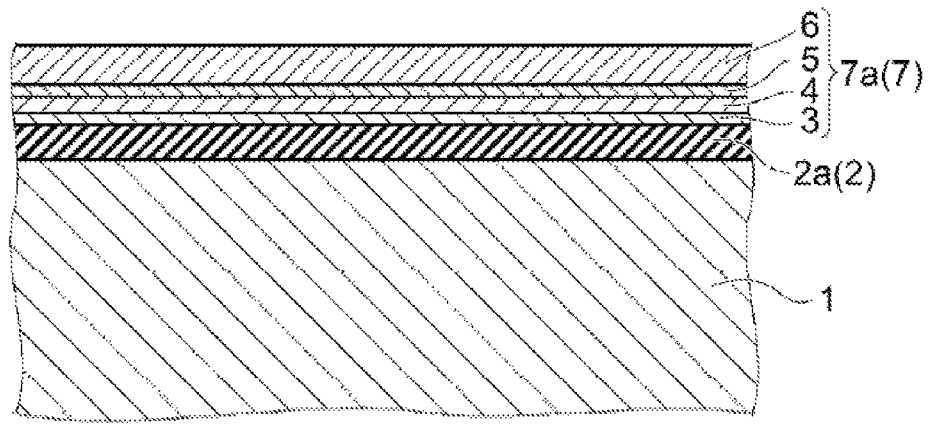

As shown in FIG. 1B, the film 7a, which is used as floating gate 7, is formed on film 2a. The film 7a is a silicon film into which boron is added. When boron is simply added into the silicon film, it is difficult to control the uniformity of the thickness of the film in the initial stage of the reaction. Thus, it is difficult to form a thin film. Also, since the silicon atoms existing on the surface of the film flow significantly due to the doping of boron, aggregation of the atoms occurs when forming the thin film, making it difficult to form a film with a uniform thickness. In order to handle this problem, the film 7a is formed using a method as described below.

To form the film 7a as floating gate 7, a seed layer 3 containing amorphous silicon is first formed on the film 2a. In the case where the seed layer 3 including polysilicon is formed using the LPCVD (low pressure chemical vapor deposition) method using silane ($SiH_4$) as the reactive gas, it is difficult to make the seed layer 3 flat. When bumps and dips exist on the surface of the seed layer 3, concentration of electric field and other problems will occur. Therefore, in the semiconductor device fabrication according to this embodiment, the seed layer 3 including amorphous silicon is formed using the LPCVD method using disilane ($Si_2H_6$) gas as the reactive gas.

In addition, to improve the flatness of the seed layer 3, the film is formed at a low temperature, and the seed layer 3 is formed not to be excessively thick. In this case, for example, the temperature for forming the seed layer 3 is in the range of 400° C. to 420° C., and the thickness of the seed layer 3 is about 0.5 to 3 nm.

Then, boron is adsorbed to the seed layer 3 to form a boron-containing impurity layer 4. For example, after the seed layer 3 is formed, boron trichloride ($BCl_3$) gas is fed into the chamber to expose the surface of the seed layer 3 to the atmosphere of the boron trichloride gas. As a result, boron is adsorbed on the seed layer 3 to form the boron-containing impurity layer 4. The temperature at which boron is adsorbed can be set, for example, to 400° C. to 420° C. In this case, the boron-containing impurity layer 4 can be formed in the same chamber after the seed layer 3 is formed.

Then, a silicon-containing cap layer 5 is formed on the boron-containing impurity layer 4. It is noted, here, that boron has a catalytic effect. Thus, when a layer including polysilicon is formed at a temperature of about 500° C. to 515° C. on the boron-containing impurity layer 4, flowing of the silicon atoms existing on the surface of the layer becomes significant. As a result, aggregation of the atoms occurs when forming the thin layer, making it difficult to form a layer with uniform thickness. To handle this problem, in the semiconductor device fabrication according to this embodiment, the cap layer 5 is formed on the boron-containing impurity layer 4. Due to this method, a layer with uniform thickness can be formed on the cap layer 5.

For example, after the boron-containing impurity layer 4 is formed, silane gas is fed into the chamber to expose the surface of the boron-containing impurity layer 4 to the atmosphere of the silane gas to grow silicon on the boron-containing impurity layer 4. In this way, the cap layer 5 can be formed. In this case, the cap layer 5 includes amorphous silicon.

The temperature for forming the cap layer 5 can be set to, for example, 400° C. to 420° C. In general, the temperature for growing silicon is in the range of 500° C. to 515° C. and so silicon cannot be grown at a temperature in the range of 400° C. to 420° C. However, in the embodiment, since boron has catalytic effect, it is possible to grow silicon even at a temperature in the range of 400° C. to 420° C. The total thickness of the boron-containing impurity layer 4 and the cap layer 5 is about 1.5 nm.

In the embodiment, the cap layer 5 can be formed in the same chamber after formation of the boron-containing impurity layer 4. Then, if necessary, an adjustment layer 6 containing silicon is formed on the cap layer 5.

The thickness of the film to be formed may be regulated depending on the type of the semiconductor device. It may be necessary to make adjustments to increase the thickness of the film. Also, it may be necessary to make adjustments to lower the impurity concentration in the formed film depending on the type of the semiconductor device. Therefore, the adjustment layer 6 is formed, if preferable, in the semiconductor device fabrication according to this embodiment.

If the adjustment layer 6 is formed, it is possible to increase the thickness of the floating gate 7. Also, if the adjustment layer 6 is formed, the volume of an area to which boron is diffused, increases. Therefore, it is possible to make adjustments so that the concentration of boron in the floating gate 7 is lowered.

The adjustment layer 6, for example, can be formed using the LPCVD method using silane ($SiH_4$) gas as the reactive gas. The adjustment layer 6 can be formed in the same chamber after the formation of the cap layer 5. The temperature for forming the adjustment layer 6, for example, can be set to about 500° C. to 515° C.

In this case, it is necessary to raise the temperature from 400° C. to 420° C. to about 500° C. to 515° C. It is preferred to feed hydrogen gas into the chamber and raise the temperature in the atmosphere of the hydrogen gas. As a result, the adjustment layer 6 that is formed includes amorphous silicon.

The thickness of the adjustment layer 6 can vary depending on the thickness of the floating gate 7 and the value of the boron concentration, and the like.

When the boron-containing impurity layer 4 is included in the film 7a, the thickness of the adjustment layer 6 can be adjusted to, for example, 2 nm to 20 nm.

In forming the film 7a the concentration of boron in the floating gate 7 can be increased by stacking a plurality of the boron-containing impurity layers 4 and the cap layers 5 alternately.

The concentration of boron varies depending on the type of the semiconductor device. For example, the concentration of boron in the film 7a can be set to about $3 \times 10^{14}$ atoms/cm$^2$ in surface density. In this case, if the thickness of the film 7a is about 10 nm, the concentration of boron is about $3 \times 10^{20}$ atoms/cm$^3$.

The film 7a can be formed into the floating gate 7 as described above. In general, in the case of forming a film 7a including silicon doped with boron, silane gas and boron compound are fed into a chamber at the same time, and boron is added while the film is being formed. However, if such a method is used, the concentration of boron may vary significantly depending on the mounting position of the wafer in the chamber. In other words, if such a method is used, the stability of the process or the stability of the quality may decrease.

Therefore, in the semiconductor device fabrication according to this embodiment, the Gas Phase Doping (GPD) method, which thermally decomposes a boron compound at the time of forming the boron-containing impurity layer 4, is used. If the GPD method is used, the vary of the concentration of boron due to the mounting position of the wafer in the chamber can significantly decrease and the boron can be adsorbed uniformly. Therefore, the stability of the process and quality can be improved.

In the semiconductor device fabrication according to this embodiment, the seed layer 3 containing amorphous silicon is formed on the film 2a. Also, to improve the flatness of the seed layer 3, the seed layer 3 is formed at a low temperature and the seed layer 3 is formed not to be excessively thick. As a result, when boron is adsorbed to form the boron-containing impurity layer 4, it is possible to form the boron-containing impurity layer 4 on a thin flat seed layer 3.

Also, since the silicon-containing cap layer 5 is formed on the boron-containing impurity layer 4, flowing of the silicon atoms on the surface of the layer formed on the impurity layer 4 can be restrained. Therefore, it is possible to form a thin, uniform, and flat floating gate 7.

In addition, the seed layer 3, the boron-containing impurity layer 4, and the cap layer 5 can be formed continuously in the same chamber. In addition, the temperature used for forming each layer can be almost the same. Consequently, the productivity can be improved.

The thickness and boron concentration of the floating gate 7 can be adjusted by forming the adjustment layer 6.

Figure 2A:
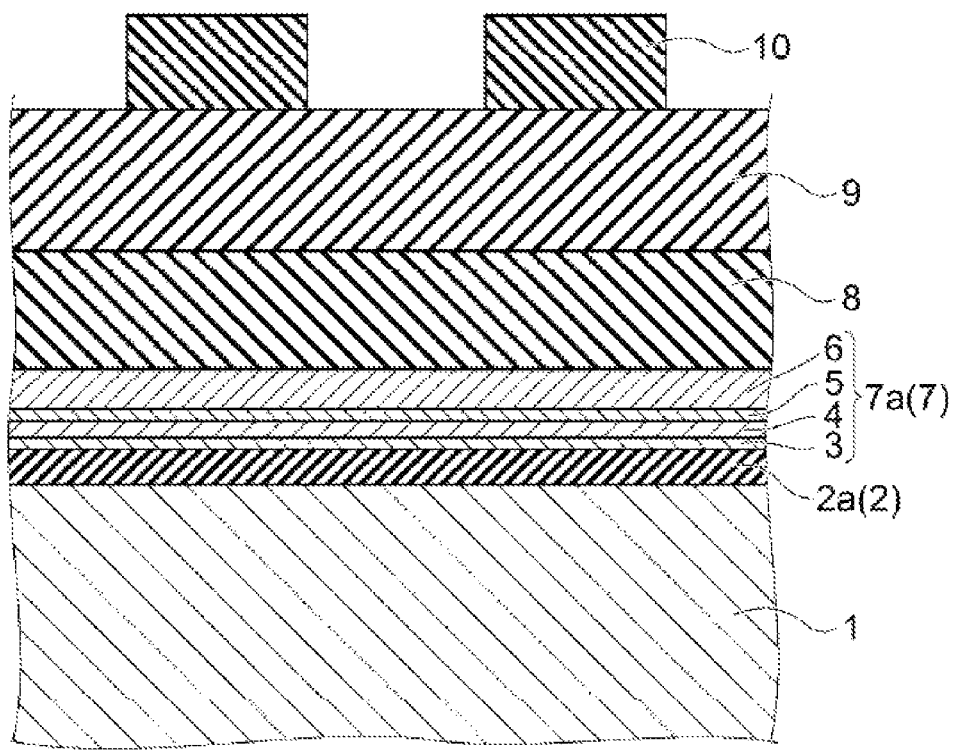
FIG. 2A and FIG. 2B are schematic cross-sectional views illustrating steps of the semiconductor device fabrication method according to the first embodiment.
Figure 2B:
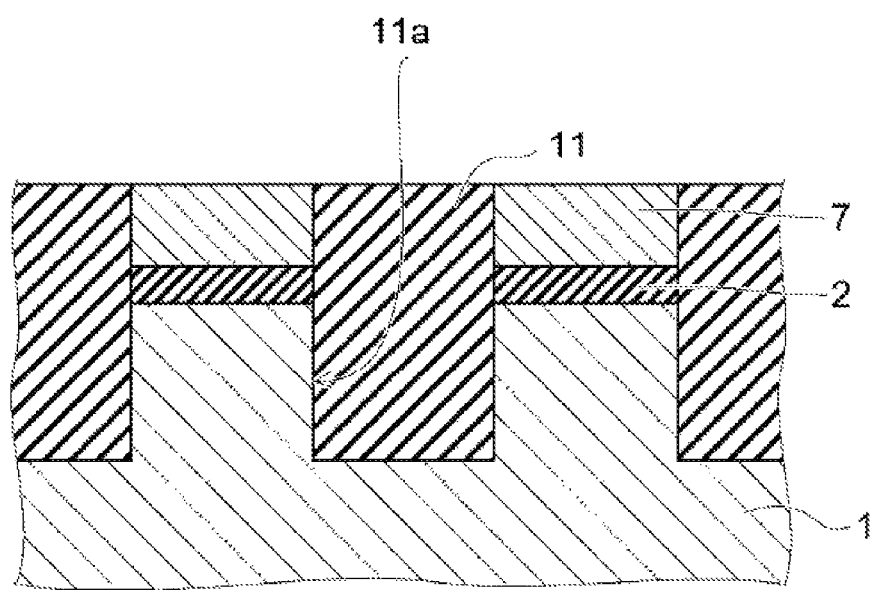

Further, FIGS. 2A and 2B illustrate an example of the semiconductor device fabrication method according to this embodiment.

As shown in FIG. 2A, a silicon nitride film 8 is formed on the film 7a, and a silicon oxide film 9 is formed on the silicon nitride film 8. As to be described later, the silicon oxide film 9 is used as an etching mask during an etching process. The silicon nitride film 8 is also used as etching mask along with the silicon oxide film 9. It also acts as a stopper during a flattening process.

The silicon nitride film 8 and the silicon oxide film 9 can be formed, for example, by using a CVD (chemical vapor deposition) method. The thickness of the silicon nitride film 8, for example, can be set to about 50 nm to 200 nm. The thickness of the silicon oxide film 9, for example, can be set to about 50 nm to 400 nm.

Then, a photoresist is coated on the silicon oxide film 9 and a resist mask 10 is formed by patterning the photoresist using the exposure drawing method.

Then, the silicon oxide film 9 is etched with the resist mask 10 used as an etching mask. After that, a dry asking method is used to remove the resist mask 10 to form an etching mask comprised of the silicon oxide film 9.

Subsequently, the etching mask comprised of the silicon oxide film 9 is used to sequentially etch the silicon nitride film 8, the film 7a, the film 2a, and substrate 1, to form groove 11a that is used to form element separating film 11.

In this case, the silicon nitride film 8, which is etched using the etching mask comprised of the silicon oxide film 9, also acts as an etching mask to etch the films underneath the silicon nitride film 8. Therefore, etching is carried out using the etching mask comprised of the silicon oxide film 9 and the etching mask comprised of the silicon nitride film 8 at the time of etching the films underneath the silicon nitride film 8.

The silicon oxide film 9, the silicon nitride film 8, the film 7a, the film 2a, and the substrate 1 can be etched by using the RIE (Reactive Ion Etching) method.

Then, a post-oxidation treatment is carried out at a high temperature to eliminate the damages on the formed cross section due to etching. The high-temperature post-oxidation treatment can be carried out by raising the temperature to about 800° C. in an oxygen atmosphere. During the high-temperature post-oxidation treatment, the boron in boron-containing impurity layer 4 is diffused in the film 7a. At this process, silicon is crystallized in the film 7a.

It is also possible to carry out the thermal treatment separately for diffusing the boron and crystallizing the silicon from the damage eliminating process. In this case, there is no limit on the time of carrying out thermal treatment for diffusing the boron and crystallizing the silicon as long as it is after the film 7a is formed.

However, since the surface of the film 7a is exposed right after the film 7a is formed, bumps and dips may occur on the surface of the film 7a while silicon is crystallized. Therefore, it is preferred to carry out the thermal treatment right after the film 13a is formed, than immediately after the film 7a is formed.

If the silicon is crystallized immediately after the film 7a is formed, the bumps and dips formed on the surface of the film 7a during crystallization of the silicon can be eliminated by means of a wet treatment (COM treatment or the like) using a chemical solution to flatten the surface of the film 7a.

The temperature in the thermal treatment for diffusing the boron and crystallizing the silicon can be set to, for example, 700° C. to 900° C. Then, an insulator is filled in the groove 11a. For example, the CVD method or the like is used to deposit a TEOS (Tetra Ethyl Ortho Silicate) film to fill an oxide inside groove 11a.

The deposition dimension of the TEOS film can be set to, for example, about 200 nm to 1500 nm. It is also possible to increase the density of the insulator, that is, the element separating film 11 filled in groove 11a by means of heating in a nitrogen atmosphere or an oxygen atmosphere. Then, with silicon nitride film 8 used as a stopper, the CMP (chemical mechanical polishing) method is used to flatten the entire surface. Then, the remaining silicon nitride film 8 is selectively removed using, for example, the hot phosphoric acid method with a high selection ratio of the silicon nitride film 8 and TEOS film (silicon oxide film).

Accordingly, the structural body shown in FIG. 2B can be formed using the fabrication method as described above. In other words, a structural body in which the tunnel insulating film 2 and the floating gate 7 are formed on the substrate 1, and in which the tunnel insulating film 2 and the floating gate 7 are separated by the element separating film 11 can be formed.

The method of forming the groove 11a, which is used for forming the element separating film 11, is not limited to the method of using the etching mask comprised of a laminated film of the silicon oxide film 9 and the silicon nitride film 8 For example, if the film thickness and the etching conditions are set appropriately, it is also possible to use a etching mask comprised of either the silicon oxide film 9 or the silicon nitride film 8. The material of the etching mask is not limited to the one described in the example, either. Any material can be used as long as it has a selection ratio with the element separating film 11.

Then, as shown in FIG. 3, the film 13a, which is used as the integral insulating film 13, is formed on the flattened surface. The thickness of the film 13a can be set to about 1 nm to 120 nm. The film 13a can be formed using, for example, the sputtering method. The film 13a can be formed using a material with high dielectric constant. An example of the material with high dielectric constant is aluminum oxide ($Al_2O_3$). In this case, aluminum oxide with relative permittivity of about 8 can be used.

It is also possible to use the following materials. For example, it is possible to use silicon dioxide ($SiO_2$) with a relative permittivity higher than 3.8; strontium oxide (SrO) with a relative permittivity of about 6; silicon nitride ($Si_3N_4$) with a relative permittivity of about 7; magnesium oxide (MgO) with a relative permittivity of about 10; scandium oxide ($Sc_2O_3$) with a relative permittivity of about 14; gadolinium oxide ($Gd_2O_3$) with a relative permittivity of about 14; yttrium oxide ($Y_2O_3$) with a relative permittivity of about 16; samarium oxide ($Sm_2O_3$) with a relative permittivity of about 16; hafnium oxide ($HfO_2$) with a relative permittivity of about 22; zirconium oxide ($ZrO_2$) with a relative permittivity of about 22; tantalum oxide ($Ta_2O_5$) with a relative permittivity of about 25; lanthanum oxide ($La_2O_3$) with a relative permittivity of about 25, barium oxide (BaO) with a relative permittivity of about 35, and bismuth oxide ($Bi_2O_3$) with a relative permittivity of about 40.

The film 13a can be a single-layer film having one type of material or a laminated film having a plurality of layers having different materials. In this case, it is also possible to use a laminated film formed by laminating layers including material with high dielectric constant and layers including silicon oxide. When the film 13a is formed into a laminated film, there is no limit on the number of the laminated layers. For example, it is possible to use a laminated film having 3 or more layers.

Then, the film 14a, which is used as the control gate 14, is formed on the insulating film 13 as shown in FIG. 4. The thickness of the film 14a can be set to, for example, about 10 nm to 200 nm. The film 14a can also contain silicon. For example, the film 14a can be formed into a polysilicon film using the LPCVD method.

Then, a silicon nitride film 15 is formed on the film 14a as shown in FIG. 5. The silicon nitride film 15 is used as an etching mask during an etching process. The silicon nitride film 15 can be formed using, for example, the CVD method. The thickness of the silicon nitride film 15 can be set to, for example, about 10 nm to 500 nm.

Then, a photoresist is coated on the silicon nitride film 15 and a resist mask 16 is formed by patterning the photoresist using an exposure drawing method.

Then, with the resist mask 16 used as an etching mask, the silicon nitride film 15 is etched. Then, the resist mask is removed by the dry asking method or the like, and the silicon nitride film 15 is formed into an etching mask.

Then, the etching mask comprised of the silicon nitride film 15 is used to sequentially etch the films underneath the silicon nitride film 15 until the surface of the substrate 1 is exposed. This etching can be carried out using, for example, by the RIE method.

After that, the etching mask comprised of the silicon nitride film 15 is removed to form a memory cell 20 that comprises laminated films of the tunnel insulating film 2, the floating gate 7, the integral insulating film 13, and the control gate 14. Accordingly, the semiconductor device 30 having the memory cell 20 can be fabricated as described above.

Second Embodiment

In the following, the semiconductor device fabrication method according to the second embodiment will be explained.

Figure 6:
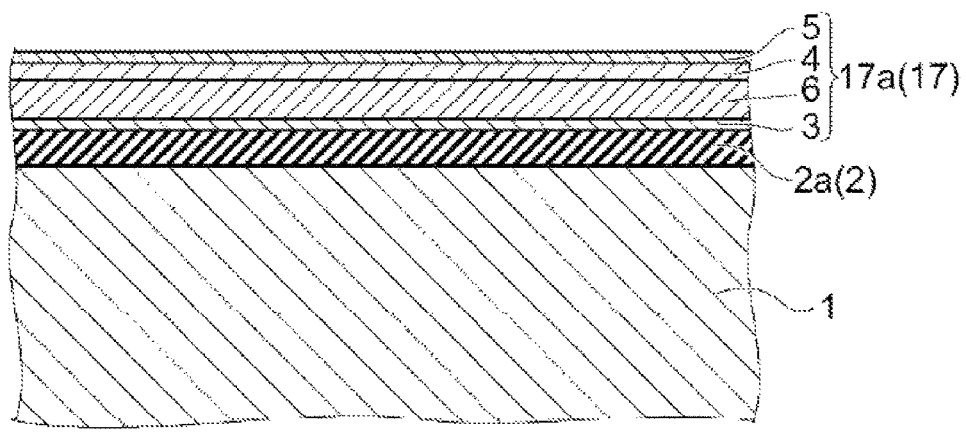
FIG. 6 is a schematic cross-sectional view illustrating steps of a semiconductor device fabrication method according to a second embodiment.

FIG. 6 is a schematic process cross-sectional view illustrating one or more steps of the semiconductor device fabrication method according to the second embodiment. In the semiconductor device fabrication method according to this embodiment, the procedure for forming the film 17a, as the floating gate 17, is different from that shown in FIG. 1B. In the semiconductor device fabrication method according to this embodiment, the film 17a, which is used as the floating gate 17, is formed as follows.

First, as shown in FIG. 6, the seed layer 3 containing amorphous silicon is formed on the film 2a. Then, the adjustment layer 6 is formed on the seed layer 3. Then, the boron-containing impurity layer 4 is formed on the adjustment layer 6. Then, the silicon-containing cap layer 5 is formed on the boron-containing impurity layer 4.

Thus, in the semiconductor device fabrication method according to this embodiment, the adjustment layer 6 is formed between the seed layer 3 and the boron-containing impurity layer 4. Therefore, the boron-containing impurity layer 4 is formed on an upper side in the film 17a.

In the fabrication method according to this embodiment, the adjustment layer 6 can also be flattened by forming the seed layer 3.

In addition, since the silicon-containing cap layer 5 is formed on the boron-containing impurity layer 4, flowing of the silicon atoms on the surface of the layer formed on the boron-containing impurity layer 4 can be restrained. Therefore, it is possible to form a thin, uniform, and flat floating gate 17.

Since the material, dimensions, and forming method of each layer are the same as those shown in FIG. 1B, detailed explanation is omitted.

In this case, when the boron in the boron-containing impurity layer 4 is diffused inside the films 7a and 17a, used as the floating gates 7 and 17, respectively, it is mainly diffused outwards. Therefore, the boron is mainly diffused to the top of the device (i.e., toward the film 13a, used as the integral insulating film 13).

Figure 7A:
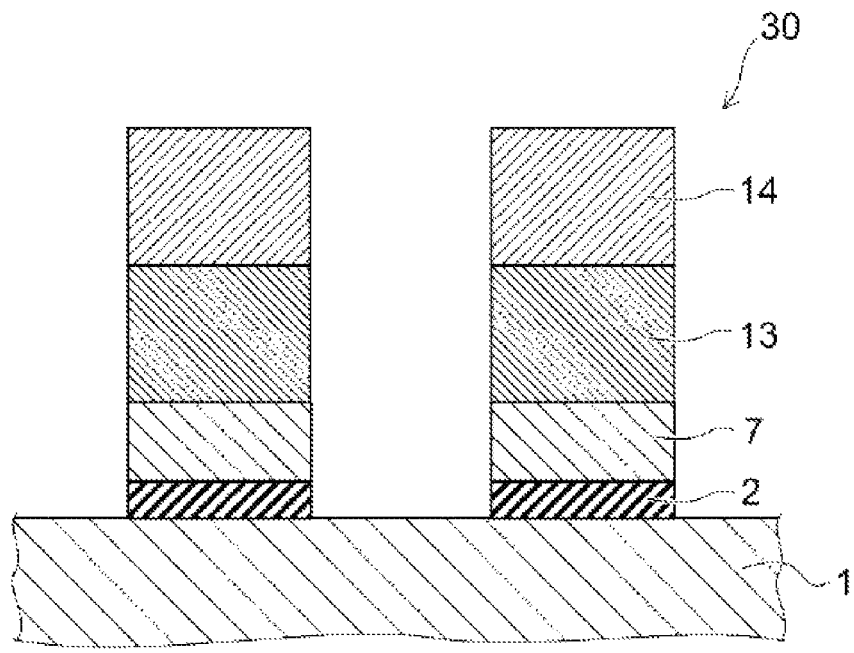
FIG. 7A and FIG. 7B are schematic cross-sectional views illustrating different concentration distribution of boron in a floating gate.
Figure 7B:
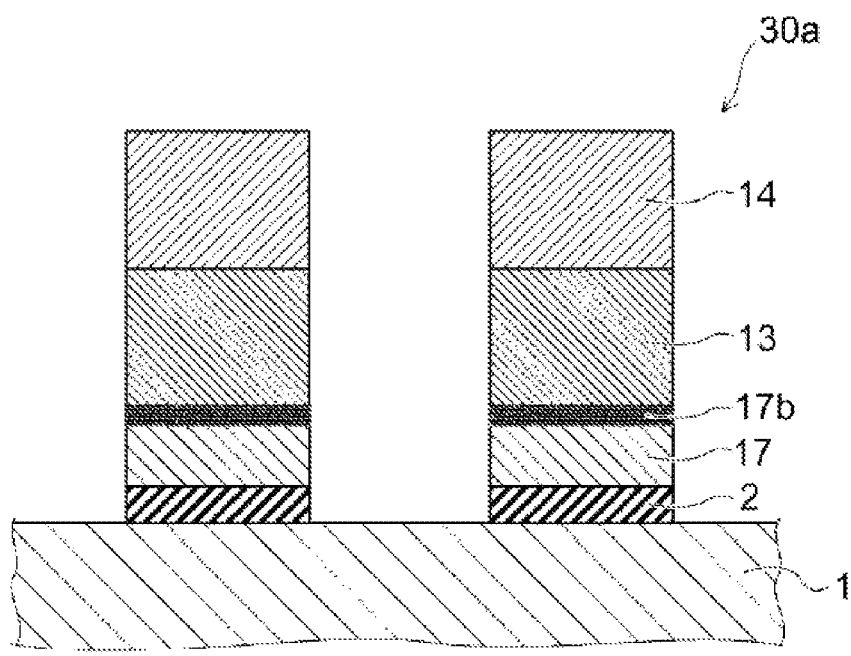

FIG. 7A and FIG. 7B are schematic cross-sectional views illustrating the concentration distribution of boron in the floating gate.

If the boron-containing impurity layer 4 is disposed on the lower side in the film 7a, as shown in FIG. 1B, the concentration distribution of boron inside the film 7a, can be made uniformly. Therefore, a floating gate 7 with more uniform concentration distribution of boron can be obtained as in the semiconductor device 30 shown in FIG. 7A.

On the other hand, if the boron-containing impurity layer 4 is formed on the upper side in film 17a as shown in FIG. 6, the concentration of boron on the side of the film 13, used as the integral insulating film 13a, becomes higher than that on the side of the tunnel insulating film 2. Therefore, it is possible to obtain a floating gate 17 having a region 17b with higher boron concentration on the side of the integral insulating film 13 as in the semiconductor device 30a shown in FIG. 7B.

Therefore, the semiconductor device 30a shown in FIG. 7B can have the substrate 1 containing silicon, the tunnel insulating film 2 formed on the substrate 1, the floating gate 17 formed on the tunnel insulating film 2, the integral insulating film 13 formed on the floating gate 17, and the control gate 14 formed on the integral insulating film 13. In the semiconductor device, the floating gate 17 contains silicon and boron. The concentration of boron in the floating gate 17 is higher on the side of the integral insulating film 13 than on the side of the tunnel insulating film 2.

Where the concentration of boron is high, electrons become difficult to move. Therefore, if the concentration of boron on the side of the integral insulating film 13 is high, leaking of electrons to the side of the integral insulating film 13 can be restrained. On the other hand, because it is necessary to inject and extract electrons on the side of the tunnel insulating film 2, it is preferred to make the concentration of boron at a relatively low level. Therefore, if the film 17a is formed using the method shown in FIG. 6, the performance of the flash memory can be improved.

Accordingly, the boron concentration distribution in the film can be controlled by varying the formation position of the boron-containing impurity layer 4.

Third Embodiment

In the following, the semiconductor device fabrication method according to the third embodiment will be explained.

Figure 8:
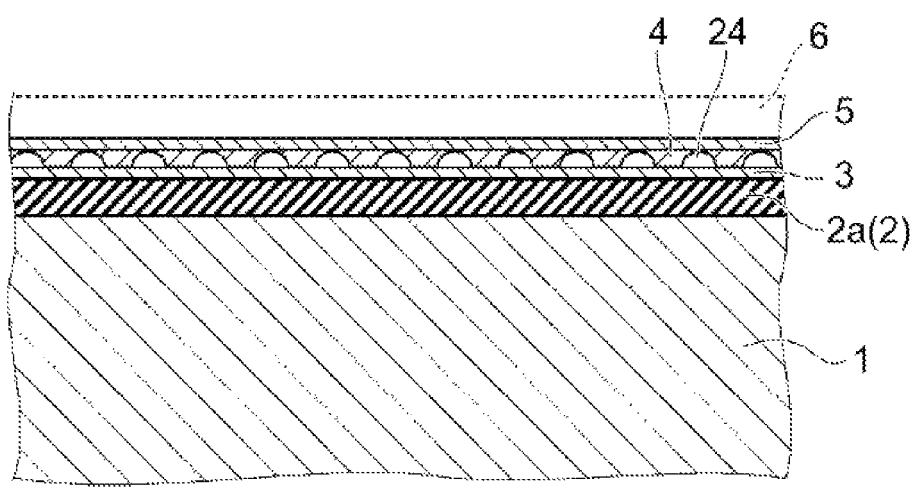
FIG. 8 is a schematic cross-sectional view illustrating the semiconductor device fabrication method according to a third embodiment.

FIG. 8 is a schematic process cross-sectional view illustrating one or more steps of the semiconductor device fabrication method according to the third embodiment.

If the adjustment layer 6 is formed as described above, the concentration of boron in the floating gate 7 can be lowered. However, the thickness of the memory cell 20 increases as much as the thickness of the adjustment layer 6. Due to the semiconductor device fabrication method according to this embodiment, the concentration of boron in the floating gate 7 can be lowered without forming the adjustment layer 6.

First, as shown in FIG. 8, seed layer 3 containing amorphous silicon is formed on the film 2a. Then, chlorine gas is fed into the chamber to expose the surface of the seed layer 3 to a chlorine gas atmosphere to form the region 24, wherein chlorine is adsorbed on the seed layer 3. The temperature for forming the region 24 wherein chlorine is adsorbed can be set to, for example, 400° C. to 420° C. In this case, the region 24 wherein chlorine is adsorbed can be formed in the same chamber after formation of the seed layer 3.

Then, boron trichloride ($BCl_3$) gas is fed into the chamber to expose the surface of the seed layer 3 to the atmosphere of the boron trichloride gas to form the boron-containing layer 4. During this process, boron is not adsorbed into the region 24 because chlorine has already been adsorbed to the region 24. Thus, the amount of boron adsorbed on the seed layer 3 can be reduced. Therefore, the concentration of boron in the floating gate 7 can be lowered, and the thickness of the memory cell 20 can be kept thin.

As described above, the semiconductor device fabrication method according to this embodiment has an additional step of forming a region 24 wherein chlorine is adsorbed on the seed layer 3. Then, in the step of forming the boron-containing impurity layer 4, the boron-containing impurity layer 4 is formed on the seed layer 3 where the region 24 is formed.

Then, the silicon-containing cap layer 5 is formed on the boron-containing impurity layer 4. If the thickness of the film is regulated or if the concentration of boron needs to be lowered further, the adjustment layer 6 can be formed on the cap layer 5. Since the material, dimensions, and forming method of each layer are the same as those shown in FIG. 1B, detailed explanation is omitted.

In addition, in the example shown in FIG. 6, the concentration of boron in the film 17a can be lowered by forming the region 24 wherein chlorine is adsorbed. It is also possible to combine the techniques of increasing the boron concentration by forming a plurality of the boron-containing impurity layers 4 and the cap layers 5 alternately, lowering the boron concentration by forming the region 24 wherein chlorine is adsorbed, and adjusting the boron concentration by using the adjustment layer 6.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A semiconductor device fabrication method comprising:
    forming a tunnel insulating film on a substrate containing silicon;
    forming a floating gate on the tunnel insulating film;
    forming a gate insulating film on the floating gate; and
    forming a control gate on the gate insulating film,
    wherein said forming the floating gate includes forming a seed layer containing amorphous silicon on the tunnel insulating film, forming an impurity layer containing boron on the seed layer, and forming a cap layer containing silicon on the impurity layer that contains boron, the impurity layer containing boron before the cap layer is formed, and
    wherein said forming the floating gate further includes forming a region in which chlorine is adsorbed on the seed layer and the impurity layer is formed on the region in which chlorine is adsorbed on the seed layer.

2. The method according to claim 1, wherein said forming the floating gate further includes forming an adjustment layer containing silicon.

3. The method according to claim 1, wherein said forming the floating gate further includes forming an adjustment layer containing silicon between the seed layer and the impurity layer.

4. The method according to claim 1, wherein the cap layer contains amorphous silicon.

5. The method according to claim 1, wherein a temperature under which the seed layer is formed is in a range of 400° C. to 420° C.

6. The method according to claim 5, wherein a temperature under which the impurity layer is formed is in a range of 400° C. to 420° C.

7. The method according to claim 6, wherein a temperature under which the cap layer is formed is in a range of 400° C. to 420° C.

8. The method according to claim 7, wherein the seed layer, impurity layer, and the cap layers are formed in a same chamber.

9. The method according to claim 1, wherein said forming the floating gate further includes conducting a post-oxidizing treatment under a temperature of about 800° C.

10. A method for fabricating a semiconductor device having a film formed by doping at least boron or germanium into silicon, the method comprising:
    forming a seed layer containing amorphous silicon;
    forming a region in which chlorine is adsorbed on the seed layer;
    forming an impurity layer containing at least boron or germanium on the region in which chlorine is adsorbed on the seed layer; and
    forming a cap layer containing silicon on the impurity layer that contains boron or germanium, the impurity layer containing boron or germanium before the cap layer is formed.

11. The method according to claim 10, further comprising:
    forming an adjustment layer containing silicon between the seed layer and the impurity layer.

12. The method according to claim 10, further comprising:

forming an adjustment layer containing silicon on the cap layer.

13. The method according to claim 10, wherein the cap layer contains amorphous silicon.

14. The method according to claim 10, wherein a temperature under which the seed layer is formed is in a range of 400° C. to 420° C.

15. The method according to claim 14, wherein a temperature under which the impurity layer is formed is in a range of 400° C. to 420° C.

16. The method according to claim 15, wherein a temperature under which the cap layer is formed is in a range of 400° C. to 420° C.

17. The method according to claim 16, wherein the seed layer, impurity layer, and the cap layer are formed in a same chamber.

18. A semiconductor device fabrication method comprising:

forming a tunnel insulating film on a substrate containing silicon;

forming a floating gate on the tunnel insulating film;

forming a gate insulating film on the floating gate; and forming a control gate on the gate insulating film, wherein said forming the floating gate includes forming a seed layer containing amorphous silicon on the tunnel insulating film, forming an impurity layer containing boron on the seed layer, and forming a cap layer containing silicon on the impurity layer that contains boron, the impurity layer containing boron before the cap layer is formed, and wherein forming the impurity layer containing boron comprises thermally decomposing a boron compound and adsorbing boron from a gas phase on the seed layer.

* * * * *